United States Patent
Hsu et al.

[11] Patent Number: 5,851,910
[45] Date of Patent: Dec. 22, 1998

[54] METHOD OF FABRICATING A BONDING PAD WINDOW

[75] Inventors: Chen-Chung Hsu, Taichung; Larry Lin, Hsinchu, both of Taiwan

[73] Assignee: United Microelectronics Corp., Taiwan

[21] Appl. No.: 927,324

[22] Filed: Sep. 11, 1997

[30] Foreign Application Priority Data

Jun. 23, 1997 [TW] Taiwan ................................. 86108732

[51] Int. Cl.⁶ ................................................. H01L 21/44
[52] U.S. Cl. ........................... 438/612; 438/621; 438/672
[58] Field of Search ................................... 438/612, 626, 438/672

[56] References Cited

U.S. PATENT DOCUMENTS

| | | | |
|---|---|---|---|
| 4,933,303 | 6/1990 | Mo ........................................... | 438/672 |
| 5,316,976 | 5/1994 | Bourg, Jr. et al. ....................... | 438/612 |
| 5,391,519 | 2/1995 | Lur et al. ................................. | 438/612 |
| 5,488,013 | 1/1996 | Geffken et al. .......................... | 438/626 |
| 5,518,963 | 5/1996 | Park .......................................... | 438/626 |
| 5,591,673 | 1/1997 | Chao et al. ............................... | 438/672 |

*Primary Examiner*—Kevin Picardat
*Attorney, Agent, or Firm*—Rabin & Champagne, P.C.

[57] ABSTRACT

A method of fabricating a bonding pad window, includes providing a substrate, which is metallized with a first metallization layer; forming a dielectric layer over the first metallization layer; defining the dielectric layer with a first mask to form a via; forming a plug in the via; forming a second metallization layer over the plug and the dielectric layer; patterning the second metallization layer to expose the dielectric layer; forming a passivation layer over the second metallization layer; and defining the passivation layer with the first mask to form the bonding pad window. This improves and simplifies the formation of a bonding pad window. For example, the process of forming a mask, which is used to form the bonding pad window, can be omitted. The previous via mask is used to form the bonding pad window and the internal circuit probing window at the same time.

9 Claims, 4 Drawing Sheets

METHOD OF FABRICATING A BONDING PAD WINDOW

BACKGROUND OF THE INVENTION

1. Field of the Invention

The invention relates in general to the fabrication of semiconductor integrated circuits (ICs), and more particularly to a method of making a bonding pad window.

2. Description of the Related Art

E-Beam Testing or Mechanical Probing is necessary at the beginning of developing a new product. As a result, a passivation layer must be partially removed to reveal a second metallization layer. Removing the passivation layer using the conventional RIE (Reactive Ion Etching) method will damage the ICs. As a result, when performing E-Beam Testing or Mechanical Probing, damage will occur.

FIGS. 1A to 1D are cross-sectional views showing a conventional process of fabricating a bonding pad window. Referring to FIG. 1A, a first metallization layer 11 is deposited on an insulating layer 10 by sputtering. The insulating layer 10 is formed over a substrate with source/drain regions (which are not shown in the Figures). The first metallization layer 11 is then formed by patterning and etching. In addition, a dielectric layer 12 is deposited over the first metallization layer 11 using CVD (Chemical Vapor Deposition). The dielectric layer 12 is $SiO_2$. Next, the dielectric layer 12 is planarized using CMP (Chemical Mechanical Polishing). A via 13 is formed by defining the dielectric layer 12 through patterning and etching.

Referring to FIG. 1B, a plug 14 is formed by depositing a conductive metal layer in the via 13 which is then etched back. The plug 14 is, for example, a tungsten plug.

A second metallization layer 15 is deposited over the plug 14 and the dielectric layer 12 by sputtering. Then, the second metallization layer 15 is defined by patterning and etching to form the profile as shown in FIG. 1C.

A passivation layer 16 is formed over the second metallization layer 15 using CVD. The passivation layer 16 is defined by forming a mask and RIE to form a bonding pad window 17 as shown in FIG. 1D.

In the above conventional process of making a bonding pad window, the masks which are used in defining the via 13 and the bonding pad window 17 are different. As a result, the complexity of fabricating the bonding pad window will increase. In the removing of the passivation layer 16, the RIE method will damage the ICs. Thus, when the E-Beam Testing or the Mechanical Probing is performed, damage will occur.

SUMMARY OF THE INVENTION

It is therefore an object of the invention to provide an improved and simplified process of forming a bonding pad window. For example, the process of forming a mask, which is conventionally used to form the bonding pad window, can be omitted. The previously-formed via mask is used to simultaneously form the bonding pad window and the internal circuit probing window to achieve the object.

The invention achieves the above-identified object by providing a new method of fabricating a bonding pad window. The method includes: providing a substrate, which is metallized with a first metallization layer; forming a dielectric layer over the first metallization layer; defining the dielectric layer with a first mask to form a via; forming a plug in the via; forming a second metallization layer over the plug and the dielectric layer; patterning the second metallization layer to expose the dielectric layer; forming a passivation layer over the second metallization layer; and defining the passivation layer with the first mask to form the bonding pad window.

The invention also achieves the above-identified object by providing another new method of fabricating a bonding pad window. The method includes providing a substrate, which is metallized with a first metallization layer; forming a dielectric layer over the first metallization layer; defining the dielectric layer with a first mask to form a via; forming a plug in the via; forming a second metallization layer over the plug and the dielectric layer; forming a silicon nitride layer over the second metallization layer; defining the second metallization layer and the silicon nitride layer by patterning and etching to expose the dielectric layer; forming a passivation layer in and over the dielectric layer; and forming the bonding pad window by etching the silicon nitride layer to expose the second metallization layer.

The invention additionally achieves the above-identified object by providing a further new method of fabricating a bonding pad window. The method includes providing a substrate which is metallized with a first metallization layer; forming a dielectric layer over the first metallization layer; defining the dielectric layer with a first mask to form a via; forming a plug in the via; forming a second metallization layer over the plug and the dielectric layer; forming a silicon nitride layer over the second metallization layer; defining the second metallization layer and the silicon nitride layer by patterning and etching to expose the dielectric layer; defining the silicon nitride layer by the first mask to expose part of the second metallization layer; forming a passivation layer in and over the dielectric layer and part of the second metallization layer; and forming the bonding pad window by etching the silicon nitride layer to expose the second metallization layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1A:
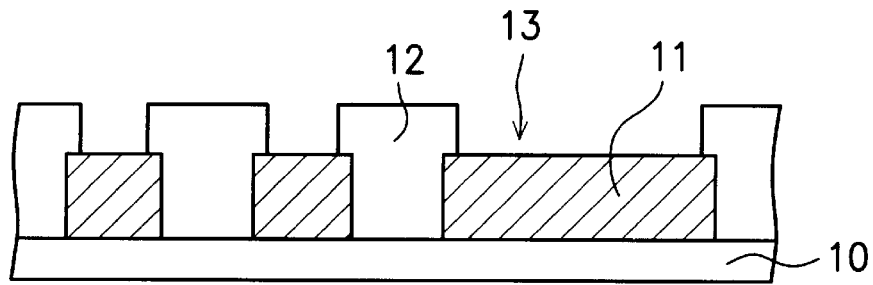
FIGS. 1A to 1D are cross-sectional views showing a conventional process of fabricating a bonding pad window.
Figure 1B:
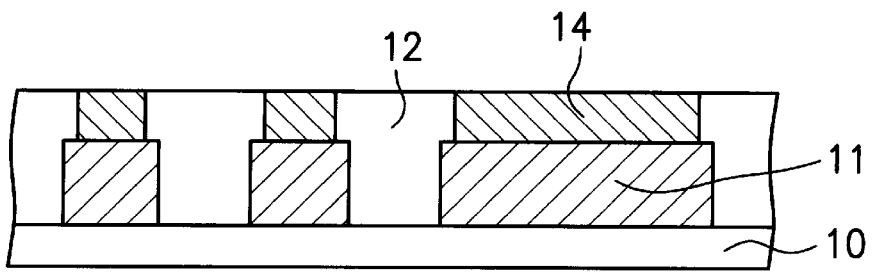
Figure 1C:
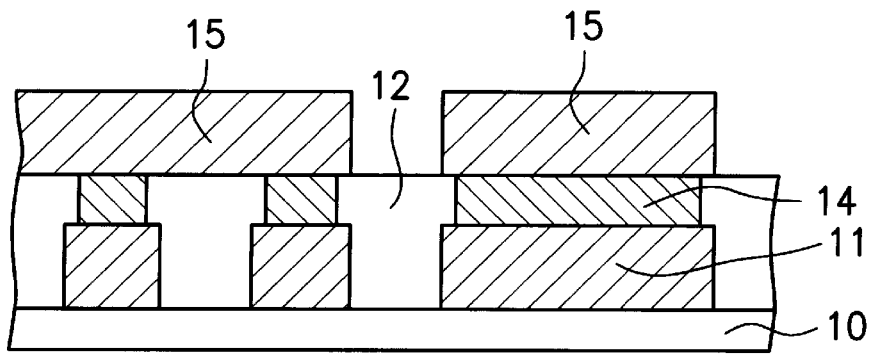
Figure 1D:
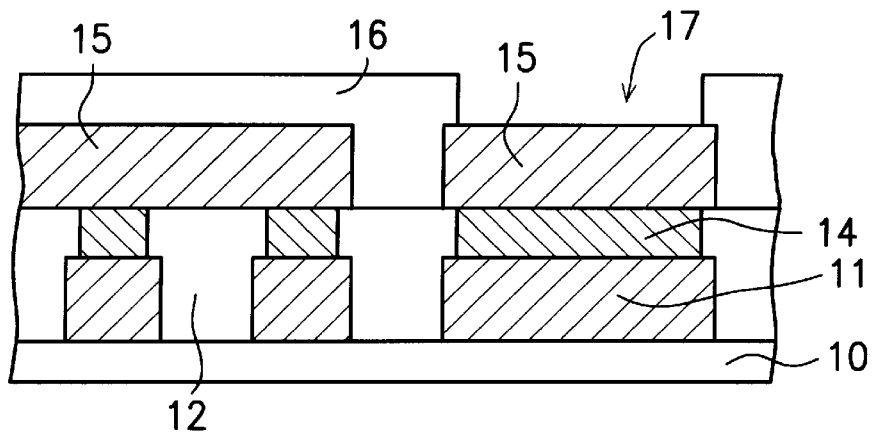
Figure 2A:
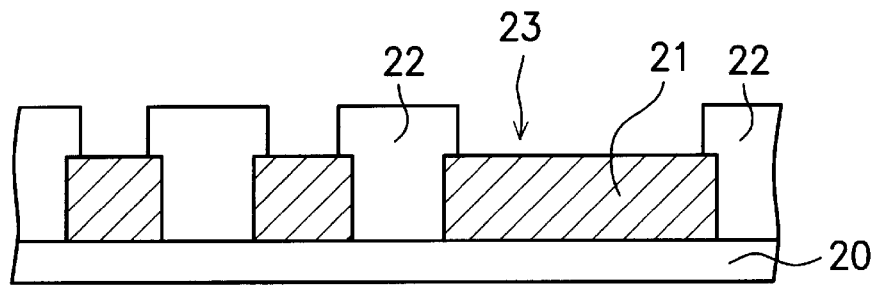
FIGS. 2A to 2D are cross-sectional views showing the process steps of one preferred embodiment of fabricating a bonding pad window.

FIGS. 2A to 2D are cross-sectional views showing the process steps of one preferred embodiment of fabricating a bonding pad window. Referring first to FIG. 2A, a first metallization layer 21 is deposited on an insulating layer 20 by sputtering. The insulating layer 20 is formed over a substrate with source/drain regions (which are not shown in the Figures). The first metallization layer 21 is formed by patterning and etching. In addition, a dielectric layer 22 is deposited over the first metallization layer 21 by CVD (Chemical Vapor Deposition). The dielectric layer 22 is $SiO_2$. Next, the dielectric layer 22 is planarized using CMP (Chemical Mechanical Polishing). A via 23 is formed by defining the dielectric layer 22 using a first mask (which is not shown in the Figure) through patterning and etching.

Figure 2B:
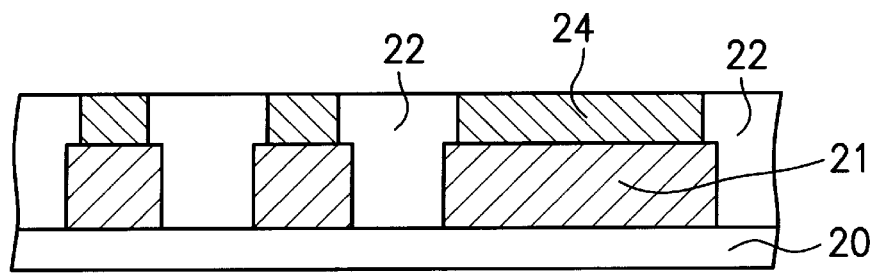

Referring next to FIG. 2B, a plug 24 is formed by depositing a conductive metal in the via 23 which is then etched back. The plug 24 is, for example, a tungsten plug.

Figure 2C:
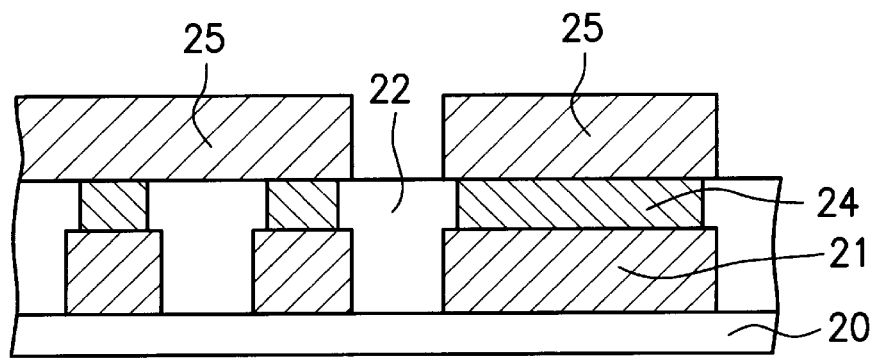

A second metallization layer 25 is deposited over the plug 24 and the dielectric layer 22 by sputtering. Then, the second metallization layer 25 is defined by patterning and etching to expose the dielectric layer 22 as shown in FIG. 2C.

Figure 2D:
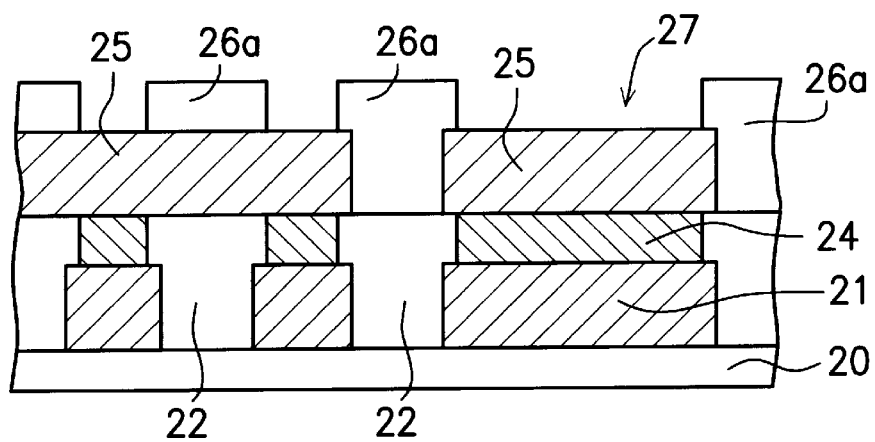

A passivation layer 26a, for example, silicon oxide, is formed over the second metallization layer 25 by CVD. The passivation layer 26a is defined using the same mask pattern which was used to form via 23. Then, a bonding pad window 27 is formed as shown in FIG. 2D.

In the preferred embodiment, the mask which is used to form the bonding pad window 27 is the same that used to form the via 23. So, the process of forming a mask, which is used to form the bonding pad window 27 by etching the passivation layer 26a, can be omitted.

Figure 3A:
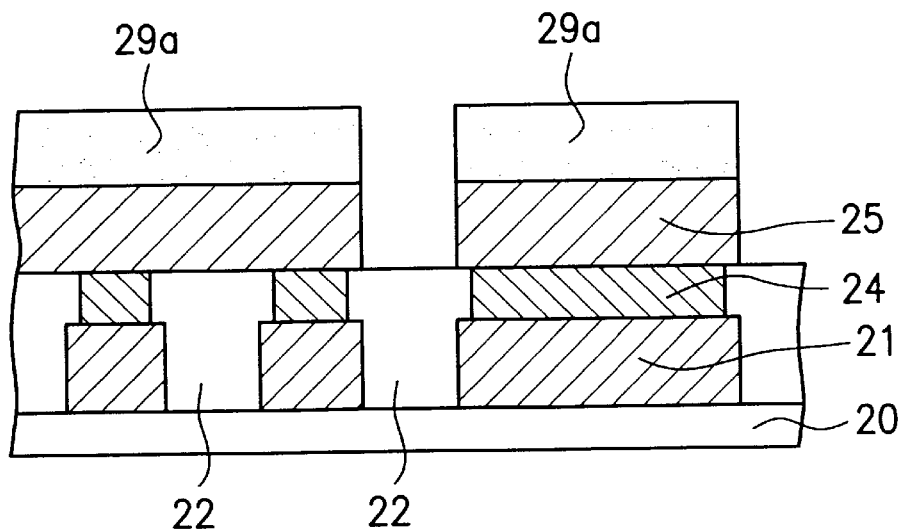
FIGS. 3A to 3B are cross-sectional views showing the process steps of another preferred embodiment of fabricating a bonding pad window.
Figure 3B:
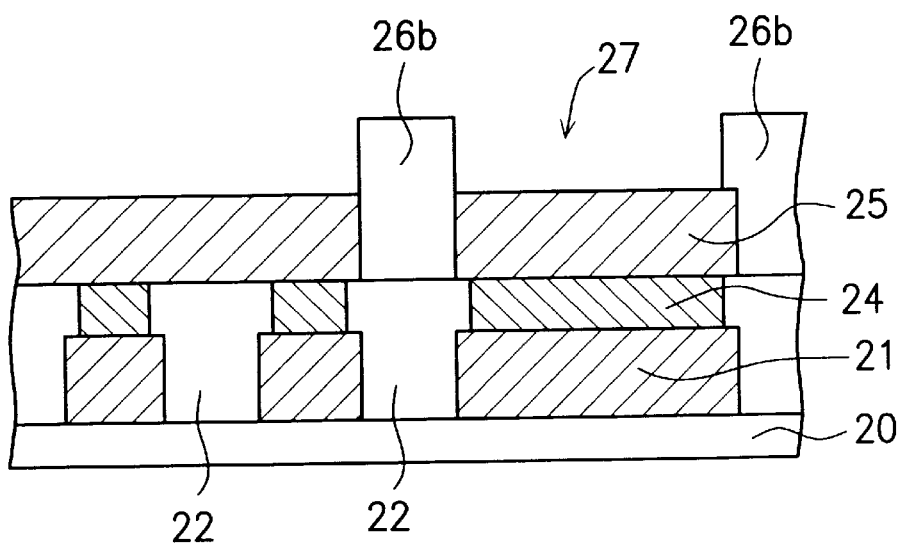

FIGS. 3A and 3B are cross-sectional views showing the process steps of another preferred embodiment of fabricating a bonding pad window. In this embodiment, since most of the techniques used in the initial stages of the manufacturing of the bonding pad window are similar to the first preferred embodiment, i.e., the resulting structure shown in FIGS. 2A through 2B, a detailed description of these initial stages is omitted. Instead, and using the structure shown in FIG. 2B as a base, only the subsequent manufacturing processes are described. Also, to simplify the explanation, elements in this embodiment that are identical to those shown in FIG. 2B are labeled with the same numerals.

Based on the structure shown in FIG. 2B, after the formation of plug 24, a second metallization layer 25 is formed over the plug 24 and the dielectric layer 22 by sputtering. A silicon nitride layer 29a is formed over the second metallization layer 25. The second metallization layer 25 and the silicon nitride layer 29a are defined by patterning and etching to expose the dielectric layer 22 as shown in FIG. 3A.

Referring to FIG. 3B, a passivation layer 26b is formed on and over the dielectric layer 22 by CVD. Then, the passivation layer 26b is polished by CMP to expose the silicon nitride layer 29a. The bonding pad window 27 is formed by selective etching the silicon nitride layer 29a to expose the second metallization layer 25.

Figure 4A:
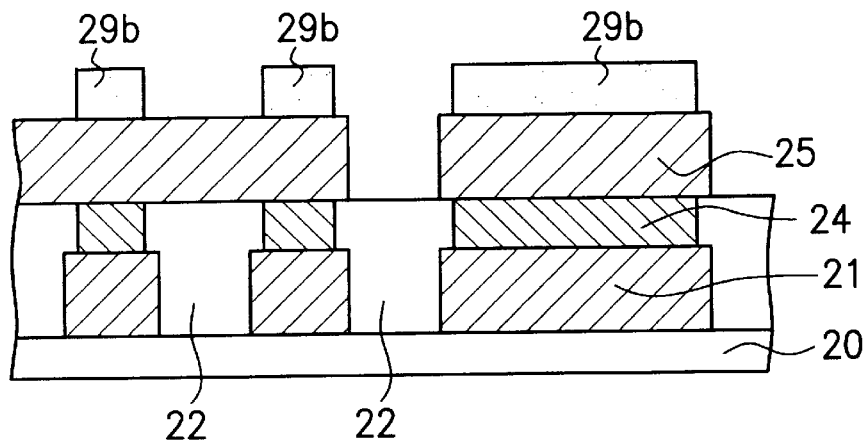
FIGS. 4A to 4C are cross-sectional views showing the process steps of a further preferred embodiment of fabricating a bonding pad window.
Figure 4B:
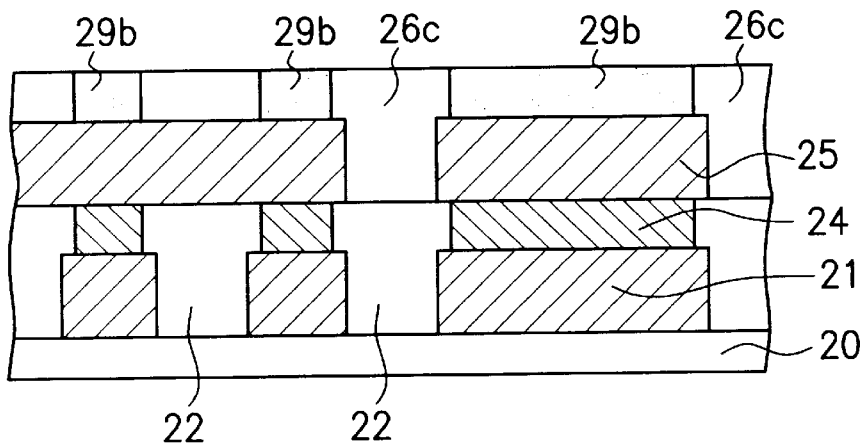
Figure 4C:
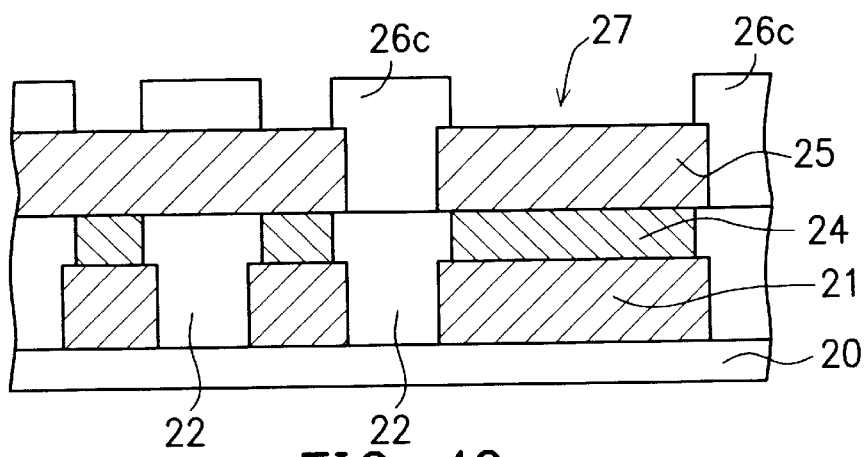

FIGS. 4A through 4C are cross-sectional views showing the process steps of another preferred embodiment of fabricating a bonding pad window. In this embodiment, since most of the techniques used in the initial stages of the manufacturing of the bonding pad window are similar to the second preferred embodiment, i.e., the resulting structure shown in FIGS. 2A through 3A, a detailed description of these initial stages is omitted. Instead, and using the structure shown in FIG. 3A as a base, only the subsequent manufacturing processes are described. Also, to simplify the explanation, elements in this embodiment that are identical to those shown in FIG. 3A are labeled with the same numerals.

Based on the structure shown in FIG. 3A, after the second metallization layer 25 and the silicon nitride layer 29a are defined, the silicon nitride layer 29a is further defined by the first mask, which is used to form the via 23, to form a silicon nitride layer 29b and expose part of the second metallization layer 25 as shown in FIG. 4A.

Referring to FIG. 4B, a passivation layer 26c is formed to fill in the second metallization layer 25 and the silicon nitride layer 29b by CVD. Then, the passivation layer 26c is planarized by CMP to be at the same height as the silicon nitride layer 29b.

Referring to FIG. 4C, a bonding pad window 27 is formed by selective etching the silicon nitride layer 29b to expose the second metallization layer 25.

While the invention has been described by way of examples and in terms of three preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a bonding pad window, comprising:

providing a substrate metallized with a first metallization layer;

forming a dielectric layer over the first metallization layer;

defining the dielectric layer using a first mask to form a via;

forming a plug in the via;

forming a second metallization layer over the plug and the dielectric layer;

forming a silicon nitride layer over and directly on the second metallization layer;

defining the second metallization layer and the silicon nitride layer by patterning and etching to expose the dielectric layer;

forming a passivation layer over and directly on the dielectric layer; and forming a bonding pad window in registration with the plug by etching the silicon nitride layer to expose the second metallization layer.

2. The method according to claim 1, wherein said forming a dielectric layer includes forming the dielectric layer using CVD.

3. The method according to claim 1, wherein said forming a dielectric layer further includes planarizing the dielectric layer using CMP.

4. The method according to claim 1, wherein said forming a dielectric layer includes comprising the dielectric layer of silicon oxide.

5. The method according to claim 1, wherein said forming a silicon nitride layer includes forming the silicon nitride layer using CVD.

6. The method according to claim 1, further comprising planarizing, after said forming a passivation layer and before said forming a bonding pad window, the passivation layer to a same height as the silicon nitride layer.

7. The method according to claim 1, wherein said defining the second metallization layer includes etching the silicon nitride layer using selective etching.

8. A method of fabricating a bonding pad window, comprising:

providing a substrate metallized with a first metallization layer;

forming a dielectric layer over the first metallization layer;

defining the dielectric layer using a first mask to form a via;

forming a plug in the via;

forming a second metallization layer over the plug and the dielectric layer;

forming a silicon nitride layer over the second metallization layer;

defining the second metallization layer and the silicon nitride layer by patterning and etching to expose the dielectric layer;

defining, after said defining the second metallization layer, the silicon nitride layer using the first mask to expose part of the second metallization layer, forming, after said defining the silicon nitride layer, a passivation layer over the dielectric layer; and forming a bonding pad window by etching the silicon nitride layer to expose the second metallization layer.

9. The method according to claim 8, wherein said forming a passivation layer further includes forming the passivation layer over part of the second metallization layer.

* * * * *